United States Patent
Watanabe et al.

(10) Patent No.: US 8,083,857 B2
(45) Date of Patent: Dec. 27, 2011

(54) SUBSTRATE CLEANING METHOD AND SUBSTRATE CLEANING APPARATUS

(75) Inventors: Tsukasa Watanabe, Nirasaki (JP); Naoki Shindo, Nirasaki (JP); Kazuyoshi Eshima, Tosu (JP)

(73) Assignee: Tokyo Electron Limited, Tokyo (JP)

(*) Notice: Subject to any disclaimer, the term of this patent is extended or adjusted under 35 U.S.C. 154(b) by 582 days.

(21) Appl. No.: 12/213,011

(22) Filed: Jun. 12, 2008

(65) Prior Publication Data

US 2008/0308120 A1 Dec. 18, 2008

(30) Foreign Application Priority Data

Jun. 15, 2007 (JP) .................. 2007-158992
Dec. 28, 2007 (JP) .................. 2007-340412

(51) Int. Cl.
*B08B 3/12* (2006.01)
(52) U.S. Cl. ............................. 134/1.3; 134/1
(58) Field of Classification Search ............... 134/1, 1.3, 134/10, 36
See application file for complete search history.

(56) References Cited

U.S. PATENT DOCUMENTS

| | | | | |
|---|---|---|---|---|
| 4,919,073 A * | 4/1990 | Kobayashi et al. | ........... | 118/688 |
| 6,048,405 A * | 4/2000 | Skrovan et al. | .................... | 134/1 |
| 2002/0144708 A1 | 10/2002 | Kashkoush et al. | ........... | 134/1.3 |
| 2003/0041876 A1* | 3/2003 | Tsuga et al. | .................... | 134/1.3 |
| 2005/0098194 A1* | 5/2005 | Christenson et al. | ............. | 134/1 |
| 2008/0035609 A1* | 2/2008 | Kashkoush et al. | ........... | 216/84 |

FOREIGN PATENT DOCUMENTS

| | | | |
|---|---|---|---|
| JP | 10-109072 | | 4/1998 |
| JP | 10109072 A | * | 4/1998 |
| JP | 10-225664 | | 8/1998 |
| JP | 2003-234320 | | 8/2003 |

OTHER PUBLICATIONS

The Aqueous Cleaning Handbook, Third Ed., 2002, p. 18.*
English Machine Translation of JP 10-109072A.*
Japanese Office Action issued on Jul. 29, 2011 for Application No. 2007-340412 w/ English language translation.

* cited by examiner

*Primary Examiner* — Michael Kornakov
*Assistant Examiner* — Nicole Blan
(74) *Attorney, Agent, or Firm* — Smith, Gambrell & Russell, LLP (57) ABSTRACT

The present invention provides a substrate cleaning method capable of reducing non-uniformity of a removal efficiency of particles between lots with a simple procedure. The substrate cleaning method comprises: a step of supplying a gas into a cleaning tank, while an irradiation of ultrasonic waves to the cleaning liquid in the cleaning tank is being stopped, so as to increase a dissolved gas concentration of the gas dissolved in the cleaning liquid in the cleaning tank to a saturated concentration; and a step of irradiating ultrasonic waves to the cleaning liquid in the cleaning tank so as to clean a substrate immersed in the cleaning liquid in the cleaning tank. In the step of increasing the dissolved gas concentration to the saturated concentration, the gas is supplied to the cleaning tank so as to increase the dissolved gas concentration of the cleaning liquid in the cleaning tank to the saturated concentration. In addition, in the step of increasing the dissolved gas concentration to the saturated concentration, the irradiation of the ultrasonic waves to the cleaning liquid in the cleaning tank is stopped.

12 Claims, 7 Drawing Sheets

SUBSTRATE CLEANING METHOD AND SUBSTRATE CLEANING APPARATUS

CROSS REFERENCE TO RELATED APPLICATIONS

This application is based upon and claims the benefit of priority from the prior Japanese Patent Application No. 2007-158992 filed on Jun. 15, 2007, and the prior Japanese Patent Application No. 2007-340412 filed on Dec. 28, 2007, the entire contents of which are incorporated herein by reference.

BACKGROUND OF THE INVENTION

1. Field of the Invention

The present invention relates to a substrate cleaning method and a substrate cleaning apparatus for removing particles adhering to a substrate to be processed by immersing the substrate to be processed into a cleaning liquid and irradiating ultrasonic waves to the cleaning liquid. In particular, the present invention relates to a substrate cleaning method and a substrate cleaning apparatus capable of restraining a variation in particle removal efficiency between lots.

In addition, the present invention relates to: a program that accomplishes the substrate cleaning method for removing particles adhering to a substrate to be processed by immersing the substrate to be processed into a cleaning liquid and irradiating ultrasonic waves to the cleaning liquid, the substrate cleaning method being capable of restraining a variation in particle removal efficiency between lots; and a program storage medium storing the program.

2. Description of Related Art

There has been known, for example, from JP10-109072A, a method of cleaning substrates to be processed by immersing the substrates to be processed into a cleaning liquid and generating ultrasonic waves in the cleaning liquid, i.e., a so-called ultrasonic cleaning method (including a megasonic process). In the ultrasonic cleaning method, in particular, in a case where a chemical liquid is used as a cleaning liquid, the cleaning liquid overflowing from a cleaning tank is often circulated and supplied again to the cleaning tank so as to be reused.

When substrates are consecutively cleaned by the ultrasonic cleaning method, a removal efficiency of particles sometimes largely varies between lots. Particularly when a cleaning liquid is circulated and supplied again, a variation in the removal efficiency tends to increase.

Figure 8:
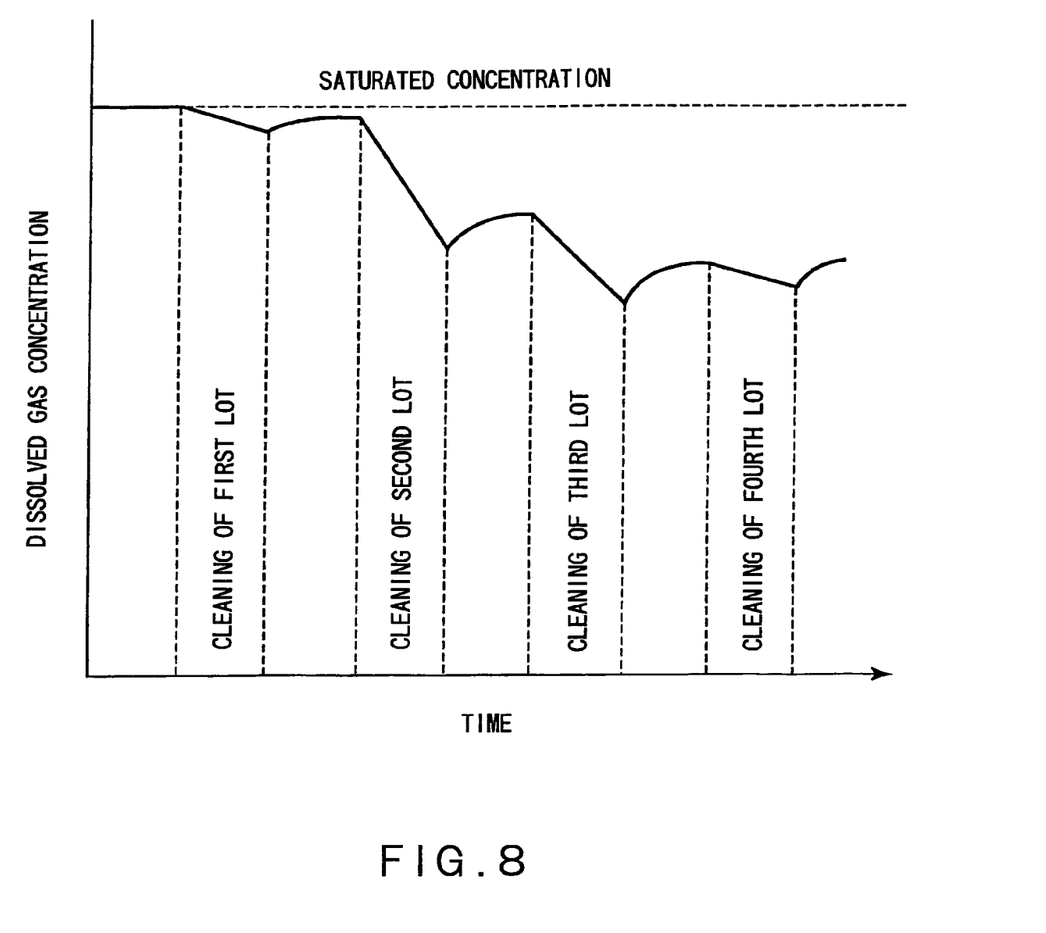
FIG. 8 is a graph showing a change over time in the dissolved gas concentration, in a case where wafers in a plurality of lots were sequentially cleaned in accordance with a conventional substrate cleaning method.

The present inventors have conducted extensive studies on this problem, and found that, when a plurality of lots are continuously subjected to the ultrasonic cleaning process, a dissolved gas concentration of a gas dissolved in a cleaning liquid will change over time because of irradiation of ultrasonic waves and/or dissolution of an atmosphere. It was also found that, particularly when the cleaning liquid is circulated and supplied, the dissolved gas concentration largely changes. FIG. 8 shows a change in the dissolved gas concentration over time, when four lots were sequentially cleaned with the use of a cleaning liquid that was circulated and supplied again. In this example, although the first lot and the fourth lot were cleaned under the same process condition (240 W, 5 minutes), the particle removal efficiency of the first lot was 72%, while the particle removal efficiency of the fourth lot was 91%.

Generally, as described in JP10-109072A, the removal efficiency of particles is considered to be susceptible to the dissolved gas concentration of the cleaning liquid. Thus, in order to restrain a variation in the removal efficiency of particles between lots, it is effective to make uniform the dissolved gas concentration of the cleaning liquid.

However, an instrument for measuring a dissolved gas concentration which has a chemical resistance is considerably expensive. Thus, in consideration of a price of a general substrate cleaning apparatus, incorporation of such a dissolved-gas concentration measuring instrument having a chemical resistance into the substrate cleaning apparatus for a mass production is not practical. Therefore, under the existing circumstances, it is difficult to grasp a variation of the dissolved gas concentration of a cleaning liquid. In addition, a dissolver for dissolving a gas in a cleaning liquid, and a degasifier for deaerating a cleaning liquid require a large installation space, and complicate the control of the substrate cleaning apparatus. Namely, even if the dissolved gas concentration can be grasped, another problem arises.

SUMMARY OF THE INVENTION

The present invention has been made in view of these respects. The object of the present invention is to provide a substrate cleaning method capable of reducing non-uniformity of a removal efficiency of particles between lots with a simple procedure.

Further, the object of the present invention is to provide a substrate cleaning apparatus of a simple structure capable of reducing non-uniformity of the removal efficiency of particles between lots.

Furthermore, the object of the present invention is to provide a program for accomplishing the substrate cleaning method capable of reducing non-uniformity of the removal efficiency of particles between lots with a simple procedure, and a program storage medium storing the program.

A first substrate cleaning method according to the present invention comprises: a step of supplying a gas into a cleaning tank, while an irradiation of ultrasonic waves to the cleaning liquid in the cleaning tank is being stopped, so as to increase a dissolved gas concentration of the gas dissolved in the cleaning liquid in the cleaning tank to a saturated concentration; and a step of irradiating ultrasonic waves to the cleaning liquid in the cleaning tank so as to clean a substrate immersed in the cleaning liquid in the cleaning tank.

In the first substrate cleaning method according to the present invention, the step of increasing the dissolved gas concentration of the cleaning liquid to the saturated concentration may be performed before the substrate is immersed into the cleaning liquid in the cleaning tank. Such a substrate cleaning method may further comprises: a step of irradiating ultrasonic waves to the cleaning liquid in the cleaning tank so as to adjust the dissolved gas concentration of the cleaning liquid in the cleaning tank, the step being performed after the step of increasing the dissolved gas concentration to the saturated concentration; and a step of immersing the substrate into the cleaning liquid in the cleaning tank, the step being performed after the step of adjusting the dissolved gas concentration of the cleaning liquid.

In addition, in the first substrate cleaning method according to the present invention, the step of increasing the dissolved gas concentration to the saturated concentration may be performed after the substrate that has been cleaned at the step of cleaning the substrate is taken out from the cleaning liquid in the cleaning tank. Such a substrate cleaning method may further comprises a step of, before a substrate to be successively processed is immersed into the cleaning liquid in the cleaning tank, irradiating ultrasonic waves to the cleaning liquid in the cleaning tank so as to adjust the dissolved gas concentration of the cleaning liquid in the cleaning tank.

Further, in the first substrate cleaning method according to the present invention, the step of cleaning the substrate may be performed at least twice so as to at least include a first step of cleaning the substrate performed before the step of increasing the dissolved gas concentration of the cleaning liquid to the saturated concentration and a second step of cleaning the substrate performed after the step of increasing the dissolved gas concentration of the cleaning liquid to the saturated concentration. Alternatively, in the first substrate cleaning method according to the present invention, the step of cleaning the substrate may be performed at least twice so as to at least include a first step of cleaning the substrate and a second step of cleaning the substrate; the step of increasing the dissolved gas concentration of the cleaning liquid to the saturated concentration may be performed at least twice so as to at least include a first step of increasing the dissolved gas concentration of the cleaning liquid to the saturated concentration and a second step of increasing the dissolved gas concentration of the cleaning liquid to the saturated concentration; and one of the first step of increasing the dissolved gas concentration of the cleaning liquid to the saturated concentration and the second step of increasing the dissolved gas concentration of the cleaning liquid to the saturated concentration may be performed between the first step of cleaning the substrate and the second step of cleaning the substrate.

Further, in the first substrate cleaning method according to the present invention, the gas may be supplied into the cleaning liquid flowing toward the cleaning tank, and may be supplied together with the cleaning liquid into the cleaning tank. In such a substrate cleaning method, the gas may be supplied into the cleaning liquid that has overflown from the cleaning tank and may be then circulated and again supplied into the cleaning tank.

Alternatively, in the first substrate cleaning method according to the present invention, the gas may be directly supplied into an inside of the cleaning tank.

Further, the first substrate cleaning method according to the present invention may further comprise a step of, before a substrate to be successively processed is delivered into the cleaning tank, replacing the cleaning liquid in the cleaning tank with a new one.

Further, in the substrate cleaning step in the first substrate cleaning method according to the present invention, in the step of cleaning the substrate, the cleaning liquid overflowing from the cleaning tank may be circulated and supplied into the cleaning tank. Alternatively, in the substrate cleaning step in the first substrate cleaning method according to the present invention, in the step of cleaning the substrate, the supply of the cleaning liquid into the cleaning tank may be stopped.

Further, the first substrate cleaning method according to the present invention may further comprise a step of adjusting a temperature of the cleaning liquid in the cleaning tank. Preferably, the step of adjusting the temperature is performed before the step of increasing the dissolved gas concentration of the cleaning liquid to the saturated concentration.

A second substrate cleaning method according to the present invention comprises: a step of supplying a cleaning liquid of a saturated concentration into a cleaning tank so that the cleaning liquid of the saturated concentration is stored in the cleaning tank; and a step of irradiating ultrasonic waves to the cleaning liquid in the cleaning tank so as to clean a substrate immersed in the cleaning liquid in the cleaning tank.

In the second substrate cleaning method according to the present invention may further comprise a step of irradiating ultrasonic waves to a cleaning liquid of a saturated concentration stored in a cleaning tank so as to adjust a dissolved gas concentration of the cleaning liquid in the cleaning tank; and a step of immersing a substrate into the cleaning liquid in the cleaning tank, wherein the step of immersing the substrate is performed after the step of adjusting the dissolved gas concentration of the cleaning liquid in the cleaning tank, and before the step of cleaning the substrate.

The second substrate cleaning method according to the present invention may further comprise a step of, before a substrate to be successively processed is delivered into the cleaning tank, replacing the cleaning liquid in the cleaning tank with a new one.

In addition, in the substrate cleaning step in the second substrate cleaning method according to the present invention, in the step of cleaning the substrate, the cleaning liquid overflowing from the cleaning tank may be circulated and supplied into the cleaning tank. Alternatively, in the substrate cleaning step in the second substrate cleaning method according to the present invention, in the step of cleaning the substrate, the supply of the cleaning liquid into the cleaning tank may be stopped.

Further, the second substrate cleaning method according to the present invention may further comprise a step of adjusting a temperature of the cleaning liquid in the cleaning tank. Preferably, the step of adjusting the temperature is performed before the step of increasing the dissolved gas concentration of the cleaning liquid to the saturated concentration.

A first substrate cleaning apparatus according to the present invention comprises: a cleaning tank capable of receiving a substrate, the cleaning tank storing a cleaning liquid; an ultrasonic generator that irradiates ultrasonic waves to the cleaning liquid in the cleaning tank; a supply pipe connected to the cleaning tank, through the supply pipe the cleaning liquid being supplied into the cleaning tank; a gas supply pipe connected to the cleaning tank or the supply pipe, through the gas supply pipe a gas being supplied to the cleaning liquid; and a control device that controls the supply of the gas from the gas supply pipe and the irradiation of the ultrasonic waves by the ultrasonic generator, wherein the control device controls the supply of the gas and the irradiation of the ultrasonic waves such that the gas is supplied from the gas supply pipe while the irradiation of the ultrasonic waves to the cleaning liquid in the cleaning tank by the ultrasonic generator is being stopped, so as to increase a dissolved gas concentration of the gas dissolved in the cleaning liquid in the cleaning tank to a saturated concentration.

In the first substrate cleaning apparatus according to the present invention, the control device may control the supply of the gas and the irradiation of the ultrasonic waves such that the dissolved gas concentration of the cleaning liquid is increased to the saturated concentration, before a substrate is immersed into the cleaning liquid in the cleaning tank. In such a substrate cleaning apparatus, the control device may control the supply of the gas and the irradiation of the ultrasonic waves such that the ultrasonic waves are irradiated to the cleaning liquid in the cleaning tank so as to adjust the dissolved gas concentration of the cleaning liquid in the cleaning tank, after the dissolved gas concentration of the cleaning liquid has been increased to the saturated concentration, and before the substrate is immersed into the cleaning liquid in the cleaning tank.

In addition, in the first substrate cleaning apparatus according to the present invention, the control device may control the supply of the gas and the irradiation of the ultrasonic waves such that the dissolved gas concentration of the cleaning liquid is increased to the saturated concentration, after the ultrasonic waves are irradiated to the cleaning liquid in the cleaning tank so as to clean the substrate immersed in the cleaning liquid in the cleaning tank and then the cleaned substrate is taken out from the cleaning liquid in the cleaning tank. In such a substrate cleaning apparatus, the control device may control the supply of the gas and the irradiation of the ultrasonic waves such that the ultrasonic waves are irradiated to the cleaning liquid in the cleaning tank so as to adjust the dissolved gas concentration of the cleaning liquid in the cleaning tank, before a substrate to be successively processed is immersed into the cleaning liquid in the cleaning tank.

Further, in the first substrate cleaning apparatus according to the present invention, the control device may control the supply of the gas and the irradiation of the ultrasonic waves such that the irradiation of the ultrasonic waves to the cleaning liquid in the cleaning tank by the ultrasonic generator is temporarily stopped so as to increase the dissolved gas concentration of the cleaning liquid to the saturated concentration, in the course of irradiating the ultrasonic waves to the cleaning liquid in the cleaning tank so as to clean the substrate immersed in the cleaning liquid in the cleaning tank.

Further, the first substrate cleaning apparatus according to the present invention may further comprise a drain pipe, through the drain pipe the cleaning liquid in the cleaning tank being drained, wherein the control device is configured to replace the cleaning liquid in the cleaning tank with a new one, before a substrate to be successively processed is delivered into the cleaning tank.

Further, in the first substrate cleaning apparatus according to the present invention, the supply pipe may be configured to circulate and supply the cleaning liquid overflowing from the cleaning tank into the cleaning tank. Alternatively, in the first substrate cleaning apparatus according to the present invention, the supply pipe may be configured to stop the supply of the cleaning liquid into the cleaning tank, during when the ultrasonic waves are irradiated to the cleaning liquid in the cleaning tank.

Further, the first substrate cleaning apparatus according to the present invention may further comprise an adjustment mechanism capable of adjusting a temperature of the cleaning liquid, wherein the control device controls the adjustment mechanism such that the temperature of the cleaning liquid in the cleaning tank is adjusted. Preferably, the adjustment of the temperature of the cleaning liquid is performed before the dissolved gas concentration of the cleaning liquid is increased to the saturated concentration.

A second substrate cleaning apparatus according to the present invention comprises a cleaning tank capable of receiving a substrate, the cleaning tank storing a cleaning liquid; an ultrasonic generator that irradiates ultrasonic waves to the cleaning liquid in the cleaning tank; and a control device that controls the irradiation of the ultrasonic waves by the ultrasonic generator, wherein the control device controls the irradiation of the ultrasonic waves such that the ultrasonic waves are irradiated to the cleaning liquid stored in the cleaning tank so as to adjust a dissolved gas concentration of the cleaning liquid in the cleaning tank, before a substrate is immersed into the cleaning liquid in the cleaning tank.

The second substrate cleaning apparatus according to the present invention may further comprise a drain pipe, through the drain pipe the cleaning liquid in the cleaning tank being drained, wherein the control device is configured to replace the cleaning liquid in the cleaning tank with a new one, before a substrate to be successively processed is delivered into the cleaning tank.

In addition, the second substrate cleaning apparatus according to the present invention may further comprise a supply pipe connected to the cleaning tank, through the supply pipe the cleaning liquid being supplied into the cleaning tank, wherein the supply pipe is configured to circulate and supply the cleaning liquid overflowing from the cleaning tank into the cleaning tank. Alternatively, the second substrate cleaning apparatus according to the present invention may further comprise a supply pipe connected to the cleaning tank, through the supply pipe the cleaning liquid being supplied to the cleaning tank, wherein the supply pipe is configured to stop the supply of the cleaning liquid into the cleaning tank, during when the ultrasonic waves are irradiated to the cleaning liquid in the cleaning tank.

The second substrate cleaning apparatus according to the present invention may further comprise an adjustment mechanism capable of adjusting a temperature of the cleaning liquid, wherein the control device controls the adjustment mechanism such that the temperature of the cleaning liquid in the cleaning tank is adjusted. Preferably, the adjustment of the temperature of the cleaning liquid is performed before the dissolved gas concentration of the cleaning liquid is increased to the saturated concentration.

A first storage medium according to the present invention is a storage medium storing a program to be executed by a control device that controls a substrate cleaning apparatus, the storage medium causing the substrate cleaning apparatus to accomplish a cleaning method for a substrate to be processed when the program is executed by the control device, the cleaning method comprising: a step of supplying a gas to a cleaning tank while an irradiation of ultrasonic waves to the cleaning liquid in the cleaning tank is being stopped so as to increase a dissolved gas concentration of the gas dissolved in the cleaning liquid in the cleaning tank to a saturated concentration; and a step of irradiating ultrasonic waves to the cleaning liquid in the cleaning tank so as to clean a substrate immersed in the cleaning liquid in the cleaning tank.

A first program according to the present invention is a program to be executed by a control device that controls a substrate cleaning apparatus, the program causing the substrate cleaning apparatus to accomplish a cleaning method for a substrate to be processed when the program is executed by the control device, the cleaning method comprising: a step of supplying a gas to a cleaning tank while an irradiation of ultrasonic waves to the cleaning liquid in the cleaning tank is being stopped so as to increase a dissolved gas concentration of the gas dissolved in the cleaning liquid in the cleaning tank to a saturated concentration; and a step of irradiating ultrasonic waves to the cleaning liquid in the cleaning tank so as to clean a substrate immersed in the cleaning liquid in the cleaning tank.

A second storage medium according to the present invention is a storage medium storing a program to be executed by a control device that controls a substrate cleaning apparatus, the storage medium causing the substrate cleaning apparatus to accomplish a cleaning method for a substrate to be processed when the program is executed by the control device, the cleaning method comprising: a step of irradiating ultrasonic waves to a cleaning liquid of a saturated concentration stored in a cleaning tank so as to adjust a dissolved gas concentration of the cleaning liquid in the cleaning tank; a step of immersing a substrate into the cleaning liquid in the cleaning tank, the dissolved gas concentration of the cleaning liquid having been adjusted; and a step of irradiating ultrasonic waves to the cleaning liquid in the cleaning tank so as to clean the substrate immersed in the cleaning liquid in the cleaning tank.

A second program according to the present invention is a program to be executed by a control device that controls a substrate cleaning apparatus, the program causing the substrate cleaning apparatus to accomplish a cleaning method for a substrate to be processed when the program is executed by the control device, the cleaning method comprising: a step of irradiating ultrasonic waves to a cleaning liquid of a saturated concentration stored in a cleaning tank so as to adjust a dissolved gas concentration of the cleaning liquid in the cleaning tank; a step of immersing a substrate into the cleaning liquid in the cleaning tank, the dissolved gas concentration of the cleaning liquid having been adjusted; and a step of irradiating ultrasonic waves to the cleaning liquid in the cleaning tank so as to clean the substrate immersed in the cleaning liquid in the cleaning tank.

According to the present invention, by using a substrate cleaning apparatus of a simple structure and a simple procedure, a dissolved gas concentration of a gas dissolved in a cleaning liquid in a cleaning tank can be promptly increased to a saturated concentration. Thus, when substrates in different lots are processed, a condition relating to the dissolved gas concentration can be promptly made uniform by the simple procedure. As a result, it is possible to reduce non-uniformity of particle removal efficiency between lots, which may be caused by difference in the dissolved gas concentration.

DETAILED DESCRIPTION OF THE INVENTION

An embodiment of the present invention will be described herebelow with reference to the drawings. Given in the following embodiment is as an example to describe a substrate cleaning apparatus according to the present invention which is applied to a cleaning apparatus for semiconductor wafers (also referred to simply as "wafer"). However, the substrate cleaning apparatus according to the present invention is not limited to the cleaning of semiconductor wafers, but can be widely applied to the cleaning of substrates.

Figure 1:
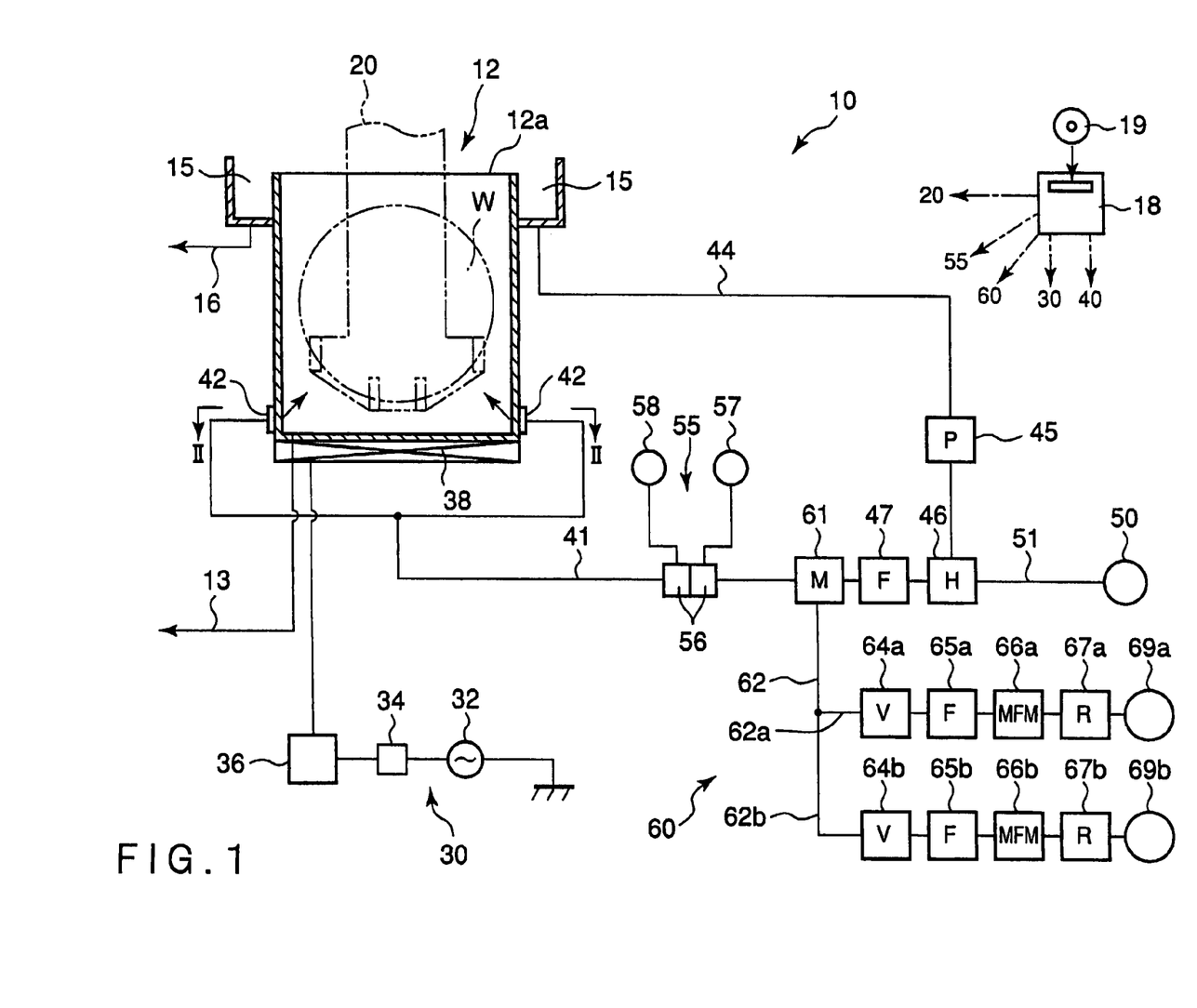
FIG. 1 is a view showing a schematic structure of one embodiment of a substrate cleaning apparatus according to the present invention.
Figure 2:
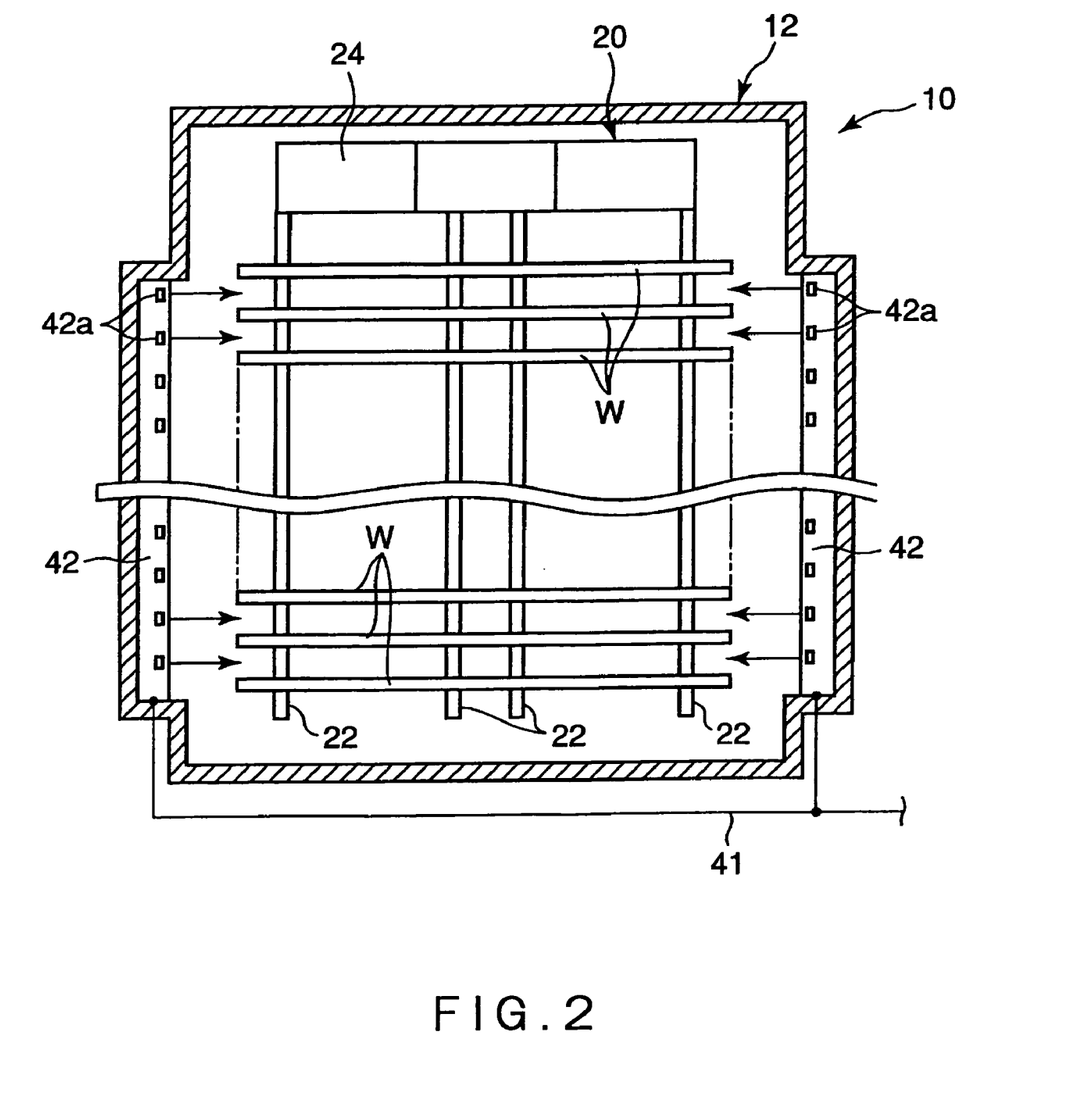
FIG. 2 is a sectional view of the substrate cleaning apparatus taken along the line II-II of FIG. 1.

FIGS. 1 to 6 are views for explaining one embodiment of a substrate cleaning method, a substrate cleaning apparatus, a program, and a storage medium according to the present invention. FIG. 1 is a view showing a schematic structure of the substrate cleaning apparatus. FIG. 2 is a sectional view of the substrate cleaning apparatus taken along the line II-II of FIG. 1.

As shown in FIGS. 1 and 2, the substrate cleaning apparatus 10 in this embodiment includes: a cleaning tank (DIP tank) 12; a cleaning-liquid supply apparatus that is connected to the cleaning tank 12 and supplies a cleaning liquid into the cleaning tank 12; a holding member (also referred to as "wafer boat") 20 that holds wafers W to be processed; an ultrasonic generator 30 that generates ultrasonic waves in a cleaning liquid in the cleaning tank 12; and a control device 18 that is connected to the cleaning-liquid supply apparatus 40 and the ultrasonic generator 30. Such a substrate cleaning apparatus 10 is an apparatus that ultrasonically cleans wafers W to be processed, by generating ultrasonic waves in a cleaning liquid stored in the cleaning tank 12 in which the wafers W to be processed are immersed.

Firstly, the cleaning-liquid supply apparatus 40 is described in detail. As shown in FIG. 1, the cleaning-liquid supply apparatus 40 is provided with a supply pipe (cleaning-liquid supply pipe) 41 connected to the cleaning tank 12. The supply pipe 41 is connected via a circulation pump 45 to a return pipe 44 connected to the cleaning tank 12. The return pipe 44 is adapted to collect a cleaning liquid flowing out from the cleaning tank 12. Thus, the supply pipe 41 and the return pipe 44 constitute a circulation path to the cleaning tank 12. The cleaning liquid circulates through the cleaning tank 12, the return pipe 44, and the supply pipe 41, by a pressure generated by the circulation pump 45. As such a circulation pump 45, there may be used, e.g., an air-driven type bellows pump capable of adjusting a discharge rate by adjusting an air pressure.

The supply pipe 41 is also connected to a deionized water source 50 through a connection pipe 51. The deionized water source 50 is adapted to supply a deionized water (DIW) to the supply pipe 41 through the connection pipe 51. The connection pipe 51 has an on-off valve, not shown. The on-off valve is connected to the control device 18, and the control device 18 controls an operation of the on-off valve. By controlling the on-off valve, the supply of a deionized water from the deionized water source 50 to the supply pipe 41 through the connection pipe 51 is controlled.

In addition, as shown in FIG. 1, the supply pipe 41 is equipped with a temperature adjustment mechanism 46 that adjusts a temperature of a cleaning liquid flowing through the supply pipe 41, and a filter 47 that removes impurities (particles or the like) from the cleaning liquid flowing through the supply pipe 41 so as to purify the cleaning liquid. In this embodiment, the temperature adjustment mechanism 46 is structured as a heater for heating the supply pipe 41. The temperature adjustment mechanism 46 is connected to the control device 18, and the control device 18 controls an operation of the temperature adjustment mechanism 46.

As shown in FIGS. 1 and 2, disposed on diverged ends of the supply pipe 41 on the side of the cleaning tank 12 (downstream side) are two cleaning liquid nozzles (cleaning-liquid discharge members) 42 which are located along opposed wall surfaces of the cleaning tank 12. Each of the cleaning liquid nozzle 42 is formed of an elongated tubular member extending along the wall surface of the cleaning tank 12. As shown in FIG. 2, the tubular member has a number of nozzle holes 42a arranged along a longitudinal direction of the tubular member at predetermined intervals. The arrangement positions of the nozzle holes 42a are determined based on arrangement positions of wafers W held by the holding member 20, which is described below.

As described above, the cleaning-liquid supply apparatus 40 is connected to the control device 18, and is controlled by the control device 18. Specifically, driving and stopping of the circulation pump 45, a discharge rate of the circulation pump 45 while it is being driven, and so on are controlled by the control device 18. A discharge rate of the circulation pump 45 while it is being driven can be adjusted by controlling an air pressure when the circulation pump 45 is an air-driven type bellows pump, or by controlling, e.g., an electric power as an input when the circulation pump 45 is a pump other than the air-driven type bellows pump.

As shown in FIG. 1, the substrate cleaning apparatus 10 further includes a gas supply apparatus 60 that is connected to the supply pipe 41 of the cleaning-liquid supply apparatus 40. The gas supply apparatus 60 is adapted to supply a gas to a cleaning liquid flowing through the supply pipe 41 toward the cleaning tank 12. The gas supply apparatus 60 has a first gas source 69a that supplies a first gas, a second gas source 69b that supplies a second gas of a different kind from the first gas, and a gas supply pipe 62. The gas supply pipe 62 connects the first gas source 69a and the second gas source 69b with the cleaning-liquid supply pipe 41. In this embodiment, the first gas source 69a is adapted to supply nitrogen, and the second gas source 69b is adapted to supply oxygen.

An upstream side of the gas supply pipe 62 is diverged into a first gas-supply pipe 62a in communication with the first gas source 69a, and a second gas-supply pipe 62b in communication with the second gas source 69b. The first gas-supply pipe 62a is equipped with, from the upstream side to the downstream side, a regulator 67a that adjusts a pressure in the first gas-supply pipe 62a, a massflow meter 66a that measures a flow rate of a gas flowing through the first gas-supply pipe 62a, a filter 65a that purifies the gas flowing through the first gas-supply pipe 62a, and an on-off valve 64a that opens and closes the first gas-supply pipe 62a. Similarly to the first gas-supply pipe 62a, the second gas-supply pipe 62b is also equipped with a regulator, 67b, a massflow meter 66b, a filter 65b, and an on-off valve 64b.

As shown in FIG. 1, a gas supply member 61 is disposed on a downstream-side end of the gas supply pipe 62. The gas supply member 61 is adapted to make a gas, which has been supplied from the gas supply pipe 62, into bubbles and supply the same to the cleaning liquid flowing through the cleaning-liquid supply pipe 41. In order that the gas can be quickly dissolved in the cleaning liquid, the gas supply member 61 is preferably capable of minutely dividing the gas so as to form minute babbles. As such a gas supply member 61, there may be used, for example, a commercially available mixer serving as a member for mixing a gas into a liquid, or a member formed of a porous material, which is capable of being positioned in the cleaning-liquid supply pipe 41. As shown in FIG. 1, in this embodiment, the gas supply member 61 is located in the circulation channel to the cleaning tank 12 at a position on the downstream side of the filter 47 where a pressure is considerably decreased.

Such a gas supply apparatus 60 is connected to the control device 18, and is controlled by the control device 18. Specifically, based on a signal from the control device 18, the gas supply apparatus 60 discharges the first gas and the second gas into the cleaning-liquid supply pipe 41 at supply rates (unit is, e.g., l/min) which are preset in accordance with a flow rate of the cleaning liquid flowing through the supply pipe 41.

In addition, as shown in FIG. 1, the substrate cleaning apparatus 10 further includes a chemical-element supply apparatus 55 connected to the supply pipe 41 of the cleaning-liquid supply apparatus 40. The chemical-element supply apparatus 55 is adapted to supply a chemical element to the cleaning liquid flowing through the supply pipe 41. Namely, by supplying a chemical element from the chemical-element supply apparatus 55, a concentration of the chemical liquid, which is circulated as a cleaning liquid through the supply pipe 41, can be adjusted, or a chemical liquid of a predetermined concentration can be generated when a deionized water from the deionized water source 50 flows as a cleaning liquid through the supply pipe 41.

The chemical-element supply apparatus 55 has a mixing valve 56 disposed in the supply pipe 41, a first chemical-element supply source 57, and a second chemical-element supply source 58, which are configured to supply a chemical element (chemical as it is, or a chemical liquid of a high concentration) to the mixing valve 56. In this embodiment, hydrogen peroxide as a first chemical element is supplied from the first chemical-element supply source 57, and ammonia as a second chemical element is supplied from the second chemical-element supply source 58. Thus, by supplying hydrogen peroxide and ammonia from the first chemical-element supply source 57 and the second chemical-element supply source 58 into the supply pipe 41 so as to mix the deionized water in the supply pipe 41 and these hydrogen peroxide and ammonia with each other, an ammonia peroxide mixture SC1 ($NH_4OH/H_2O_2/H_2O$) can be supplied into the cleaning tank 12.

Such a chemical-element supply apparatus 55 is connected to the control device 18, and is controlled by the control device 18. Specifically, based on a signal from the control device 18, the chemical-element supply apparatus 55 discharges the first chemical element and the second chemical element into the cleaning-liquid supply pipe 41 at supply rates (unit is, e.g., l/min) which are preset in accordance with a flow rate of the cleaning liquid flowing through the supply pipe 41.

Next, the cleaning tank 12 that receives a cleaning liquid from the cleaning-liquid supply apparatus 40 is described. As shown in FIGS. 1 and 2, the cleaning tank 12 has a contour substantially resembling a rectangular solid. An upper opening is formed in the cleaning tank 12 through which a wafer W can be loaded into the cleaning tank 12 and unloaded therefrom, which is described below. A drain pipe 13, which can be opened and closed, for draining a stored cleaning liquid is connected to a bottom of the cleaning tank 12.

As shown in FIG. 1, an outer tank 15 is located so as to surround the upper opening of the cleaning tank 12. The outer tank 15 is adapted to collect a cleaning liquid flowing out from the upper opening of the cleaning tank 12. Similarly to the cleaning tank 12, the outer tank 15 also has a drain pipe 16, which can be opened and closed, for draining a collected cleaning liquid. These cleaning tank 12 and the outer tank 15 are formed of, e.g., quartz having an excellent chemical resistance.

As shown in FIG. 1, an end of the return pipe 44 on the side of the cleaning tank of the cleaning-liquid supply apparatus 40 is connected to outer tank 15. Thus, a cleaning liquid overflowing from the cleaning tank 12 into the outer tank 15 can be circulated and supplied again into the cleaning tank 12 through the return pipe 44 and the supply pipe 41. It is also possible to discard the cleaning liquid overflowing from the cleaning tank 12 into the outer tank 15 through the drain pipe 16.

Next, the holding member 20 that holds wafers W is described. As shown in FIGS. 1 and 2, the holding member 20 includes four bar-like members 22 extending in substantially a horizontal direction, and a base part 24 that supports the four bar-like members 22 in a cantilever fashion. The bar-like holding members 22 are adapted to support a plurality of, e.g., 50 wafers W from below which are cleaned at the same time. In order therefore, each of the bar-like members 22 is equipped grooves (not shown) which are arranged along a longitudinal direction of the bar-like member 22 at predetermined intervals. Wafers W are engaged with the respective grooves so as to be held by the holding member 20 such that a plate surface of each of the wafers W is substantially perpendicular to a direction in which the bar-like member is extended, i.e., the plate surface of each of the wafers W is substantially parallel to a vertical direction (see, FIG. 1).

As understood from FIG. 2, the arrangement pitches of the nozzle holes 42a of the aforementioned cleaning liquid nozzle 42 are substantially the same as the arrangement pitches of the wafers W held by the holding member 20. In addition, the number of nozzle holes 42a of the aforementioned cleaning liquid nozzle 42 are arranged such that a cleaning liquid can be ejected (discharged) to spaces between the wafers W held by the holding member 20.

On the other hand, the base part 24 of the holding member 20 is connected to an elevation mechanism, not shown. By lowering the holding member 20 holding wafers W by means of the elevation mechanism, the wafers W can be immersed into the cleaning liquid stored in the cleaning tank 12. The elevation mechanism is connected to the control device 18, and the immersion of wafers W into a cleaning liquid is controlled by the control device 18.

Next, the ultrasonic generator 30 is described. As shown in FIG. 1, the ultrasonic generator 30 includes a vibrator 38 that is attached to an outer bottom surface of the cleaning tank 12, a high-frequency drive power source 32 for driving the vibrator 38, and an ultrasonic oscillator 34 connected to the high-frequency drive power source 32. In this embodiment, there are a plurality of vibrators 38, which are arranged such that the respective vibrators 38 partially occupy the outer bottom surface of the cleaning tank 12. As shown in FIG. 1, the ultrasonic generator 30 further includes a drive switch mechanism 36 connected to the ultrasonic oscillator 34 and the respective vibrators 38. Due to the drive switch mechanism 38, it is both possible to drive all the vibrators 38, and to independently drive one or more than one vibrator(s) 38.

When the vibrator(s) 38 is (are) driven to vibrate, ultrasonic waves are transmitted via the bottom of the cleaning tank 12 to the cleaning liquid stored in the cleaning tank 12, whereby ultrasonic waves are generated in the cleaning liquid in the cleaning tank 12. The ultrasonic generator 30 is connected to the control device 18, and the irradiation (application) of the ultrasonic waves to the cleaning liquid is controlled by the control device 18.

Next, the control device 18 is described. As described above, the control device 18 is connected to the respective constituent elements of the substrate cleaning apparatus 10 so as to control operations of the respective constituent elements. In this embodiment, the control device 18 includes a computer. This computer executes a program previously stored in a storage medium 19, to thereby accomplish a cleaning process of wafers W to be processed with the use of the substrate cleaning apparatus 10.

Figure 3:
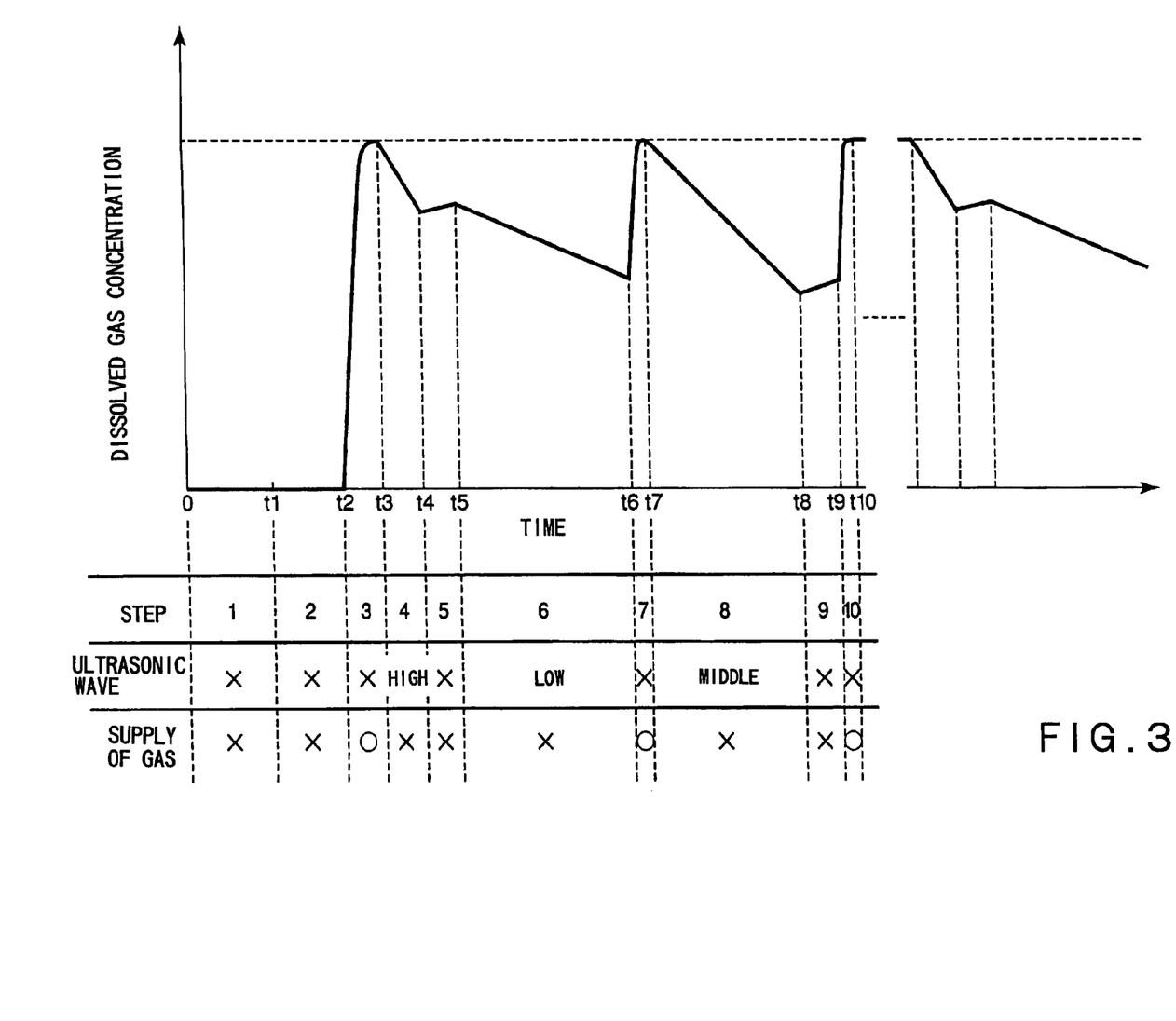
FIG. 3 is a graph showing an example of a change over time in dissolved gas concentration of a gas dissolved in a cleaning liquid in a cleaning tank, in one embodiment of a substrate cleaning method according to the present invention.

Next, an example of a cleaning method of wafers W by using the substrate cleaning apparatus 10 as structured above is described with reference mainly to Table 1 and FIGS. 3 to 6. Table 1 is a table showing an outline of the substrate cleaning method. FIG. 3 is a graph showing a change in the dissolved gas concentration of a gas dissolved in the cleaning liquid in the cleaning tank, when substrates are cleaned by a method shown in Table 1.

TABLE 1

| | Cleaning Method | | | |
|---|---|---|---|---|
| | | time (second) | supply of gas | ultrasonic wave | circulation |
| 1 | supply of cleaning liquid | | OFF | OFF | OFF |
| 2 | adjustment of temperature | | OFF | OFF | ON |
| 3 | saturation of gas | 120 | ON | OFF | ON |
| 4 | adjustment of dissolved gas concentration | 120 | OFF | HIGH | ON |
| 5 | loading of wafer | | OFF | OFF | OFF |
| 6 | ultrasonic cleaning | 300 | OFF | LOW | ON |
| 7 | saturation of gas | 30 | ON | OFF | ON |
| 8 | ultrasonic cleaning | 270 | OFF | MIDDLE | OFF |
| 9 | unloading of wafer | | OFF | OFF | OFF |
| 10 | saturation of gas | 30 | ON | HIGH | ON |

At first, as a first step, a cleaning liquid is supplied and stored in the cleaning tank 12. Specifically, based on a signal from the control device 18, a deionized water is supplied from the deionized water source 50 through the connection pipe 51 into the supply pipe 41. In addition, hydrogen peroxide is supplied from the first chemical-element supply source 57 of the chemical-element supply apparatus 55 into the supply pipe 41, and ammonia is supplied from the second chemical-element supply source 58 into the supply pipe 41. Thus, a cleaning liquid as a chemical liquid SC1 having a temperature of, e.g., 20° C. is supplied through the cleaning liquid nozzles 42 of the cleaning-liquid supply apparatus 40 into the cleaning tank 12. At this time, in accordance with a preset program, the control device 18 controls a supply rate of the deionized water supplied from the deionized water source 50, a supply rate of the first chemical element supplied from the first chemical-element supply source 57, and a supply rate of the second chemical element supplied from the second chemical-element supply source 58.

As shown in FIG. 3, in this embodiment, the deionized water supplied from the deionized water source 50 has been deaerated beforehand. Thus, at a time point to at which the first step is finished, the dissolved gas concentration of a gas dissolved in the cleaning liquid in the cleaning tank 12 is 0 ppm.

In this manner, at the time point to of FIG. 3, the cleaning tank 12 is filled with the cleaning liquid (SC1) having a dissolved gas concentration of substantially 0 ppm. Further, the cleaning liquid flows out from the cleaning tank 12 into the outer tank 15, and the return pipe 44 is filled with the cleaning liquid (SC1).

Then, as a second step, a temperature of the cleaning liquid is adjusted. Specifically, the supply of the deionized water from the deionized water source 50 to the supply pipe 41 is firstly stopped. Meanwhile, the circulation pump 45 is driven by the control device 18. As a result, the cleaning liquid is circulated through the circulation path formed by the cleaning tank 12, the return pipe 44, and the supply pipe 41. For example, when a volume of the cleaning tank 12 is 40 liters, the circulation pump 45 is driven at a discharge rate (delivering rate) of 20 l/min. Simultaneously with this drive of the circulation pump 45, the temperature adjustment mechanism 46 is activated by the control device 18. Based on a control signal from the control device 18, the temperature adjustment mechanism 46 heats the supply pipe 41 so as to adjust the temperature of the cleaning liquid flowing through the supply pipe 41.

In this manner, at a time point t2 of FIG. 3, the temperature of the cleaning liquid (SC1) in the cleaning tank 12 is increased to, e.g., 40° C.

Then, as a third step, a predetermined gas is dissolved in the cleaning liquid in the cleaning tank 12 so as to be saturated. In other words, the dissolved gas concentration of the cleaning liquid in the cleaning tank 12 is increased to a saturated concentration. To be more specific, a gas is supplied into the cleaning tank 12, while an irradiation of the ultrasonic waves from the ultrasonic generator 30 is being stopped, so as to increase the dissolved gas concentration of the gas dissolved in the cleaning liquid in the cleaning tank 12 to the saturated concentration.

In this embodiment, the control device 18 operates the gas supply apparatus 60 such that nitrogen in the form of minute babbles is supplied from the first gas source 69a of the gas supply apparatus 60 via the gas supply member 61 into the supply pipe 41. Similarly, the control device 18 operates the gas supply apparatus 60 such that oxygen in the form of minute babbles is supplied from the second gas source 69b of the gas supply apparatus 60 via the gas supply member 61 into the supply pipe 41. In addition, the control device 18 continues to operate the circulation pump 45, the temperature adjustment mechanism 46, and the chemical-element supply apparatus 55. Thus, during the third step, the cleaning liquid (SC1) is continuously circulated through the circulation path, with its temperature and concentration being maintained within predetermined ranges, respectively.

By means of these operations, the nitrogen and the oxygen together with the cleaning liquid flow through the supply pipe 41 toward the cleaning tank 12. At this time, the cleaning liquid is intensively agitated in the supply pipe 41 and the cleaning tank 12. Thus, the nitrogen and the oxygen, which become still smaller bubbles, are mixed with the cleaning liquid. As a result, as shown in FIG. 3, the nitrogen and the oxygen are quickly dissolved in the cleaning liquid, until the dissolved gas concentration of the cleaning liquid reaches the saturated concentration.

Figure 4:
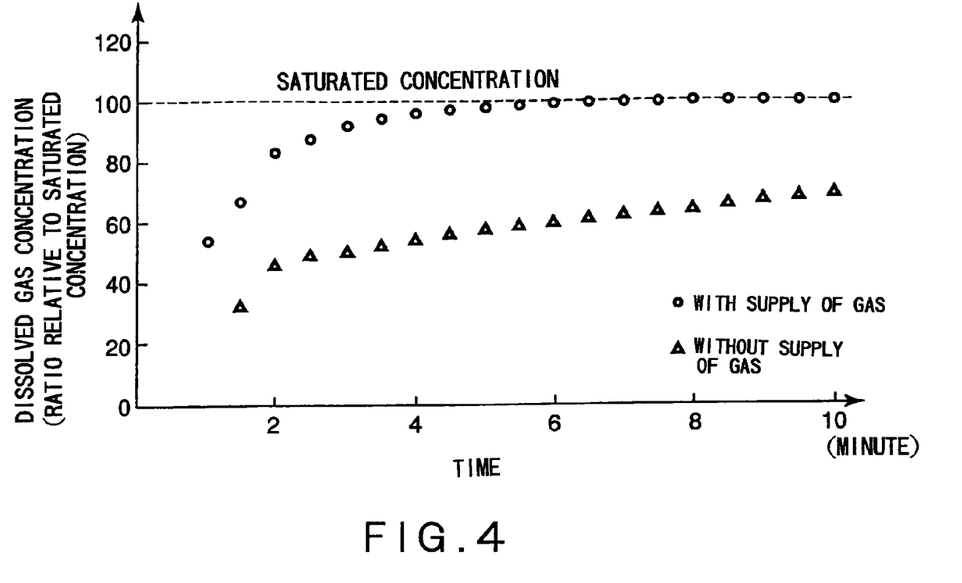
FIG. 4 is a graph showing an example of a change over time in a dissolved gas concentration of a gas dissolved in a cleaning liquid, in a case where a cleaning liquid was deaerated and left in an atmospheric air.

FIG. 4 shows an example of a change over time in a dissolved gas concentration, in a case where a deaerated deionized water was left in an atmospheric air. In the graph shown in FIG. 4, the axis of ordinate represents the dissolved gas concentration of an air dissolved in the deionized water as a ratio (percentage) relative to a saturated concentration (e.g., 18 ppm) of an air dissolved in a deionized water under the same condition. FIG. 4 shows a change in the dissolved gas concentration when an air was continuously supplied into the cleaning tank 12, and a change in the dissolved gas concentration when no air was supplied into the cleaning tank. In the case where no air was supplied, an air in the atmosphere surrounding the cleaning tank was dissolved little by little, and the dissolved gas concentration came near the saturated concentration very slowly. On the other hand, in the case where an air was supplied into the cleaning tank 12, the dissolved gas concentration was rapidly increased to the saturated concentration. In addition, by changing a condition relating to a supply rate of the air, the dissolved gas concentration could be more rapidly increased.

In this embodiment shown in Table 1 and FIG. 3, the third step was performed for 120 seconds from the time point t2 to a time point t3, during which the dissolved gas concentration of the cleaning liquid was increased from 0 ppm to the saturated concentration. When the volume of the cleaning tank is 40 liters and the discharge rate of the circulation pump 45 is 20 l/min, it may take 120 seconds=2 minutes for all the cleaning liquid in the cleaning tank 12 to be circulated one time. Particularly in this embodiment, during the third step, wafers W to be processed are not immersed in the cleaning liquid in the cleaning tank 12. Thus, even when the supply rates of nitrogen and oxygen from the gas supply apparatus 60 are increased, there is no possibility that wafers W are damaged. Accordingly, the supply rates of the nitrogen and the oxygen from the gas supply apparatus 60 can be appropriately set, to thereby increase the dissolved gas concentration of the cleaning liquid to the saturated concentration in a significantly short time period.

Herein, whether a dissolved gas concentration is a "saturated concentration" or not is judged based on two rounded-off significant digits with "ppm" as a unit, in other words, it is judged by a value, which is rounded off to 2 significant digits with "ppm" as a unit. Considering a degree of effect of the dissolved gas concentration given to the particle removal efficiency and a measurement error of a measurement apparatus, the judgment based on the two significant digits is sufficient. For example, when a saturated concentration of nitrogen under a certain condition is 16 ppm, as long as the dissolved gas concentration of the nitrogen in the cleaning liquid is not less than 15.5 ppm and less than 16.5 ppm, it is considered that the dissolved gas concentration of the nitrogen in the cleaning liquid reaches the saturated concentration, in other words, it is considered that the nitrogen is dissolved in the cleaning liquid so as to be saturated.

In this embodiment, the temperature of the cleaning liquid is increased at the second step. Then, at the third step, the nitrogen and the oxygen are dissolved in the cleaning liquid whose temperature has been increased so that the saturated concentration thereof has been decreased. Thus, the nitrogen and the oxygen can be dissolved up to the saturated concentration at the third step. In other words, when the temperature of the cleaning liquid is adjusted after the gas has been dissolved in the cleaning liquid so as to be saturated, the saturated concentration may change. In this case, the dissolved gas concentration of the cleaning liquid may fall short of the saturated concentration or exceed the saturated concentration (super saturation). However, according to this embodiment, the gas can be dissolved in the cleaning liquid such that the dissolved gas concentration reaches the saturated concentration of the cleaning liquid whose temperature has been already adjusted.

In addition, a pressure of the cleaning liquid flowing through the circulation path tends to increase as compared with a pressure in the cleaning liquid in the cleaning tank 12. With the different pressures of the cleaning liquid, the saturated concentration of the gas dissolved in the cleaning liquid also changes. In this embodiment, the gas supply member 61 is disposed on the downstream side of the filter 47 of the supply pipe 41. That is to say, the nitrogen and the oxygen are injected into the cleaning liquid in the supply pipe 41 at a position where the pressure of the cleaning liquid is considerably lowered to come near an atmospheric pressure. Therefore, the gas can be dissolved in the cleaning liquid at substantially the same dissolved gas concentration as the saturated concentration of the cleaning liquid in the cleaning tank 12 which is exposed to the atmospheric air.

Then, as a fourth step, the dissolved gas concentration of the cleaning liquid in the cleaning tank 12 is adjusted. Specifically, while the supply of the gas from the gas supply apparatus 60 is being stopped, the dissolved gas concentration of the cleaning liquid in the cleaning tank 12 is decreased by irradiating ultrasonic waves to the cleaning liquid in the cleaning tank 12. In this embodiment, during the fourth step, the control device 18 continues to operate the circulation pump 45, the temperature adjustment mechanism 46, and the chemical-element supply apparatus 55. Thus, during the fourth step, the cleaning liquid (SC1) is continuously circulated through the circulation path, with its temperature and concentration being maintained within predetermined ranges, respectively.

When ultrasonic waves are generated in the cleaning liquid, the gas dissolved in the cleaning liquid produces bubbles which then rise to the surface of the cleaning liquid. Consequently, the gas concentration of the cleaning liquid in the cleaning tank 12 is decreased. Although a mechanism of this phenomenon is not clearly known, a possible one would be as follows. At first, when ultrasonic waves are irradiated to a cleaning liquid, the ultrasonic waves are propagated in the cleaning liquid, to thereby generate a pressure variation (pressure vibration). Then, a gas dissolved in the cleaning liquid tends to gather in regions where negative pressures are produced by the ultrasonic waves. Thus, bubbles are produced in these regions, and these bubbles gradually grow large and eventually rise to the surface of the cleaning liquid. As a result, the dissolved gas concentration of the cleaning liquid in the cleaning tank 12 is decreased. However, the present invention is not limited to the above mechanism.

Figure 5:
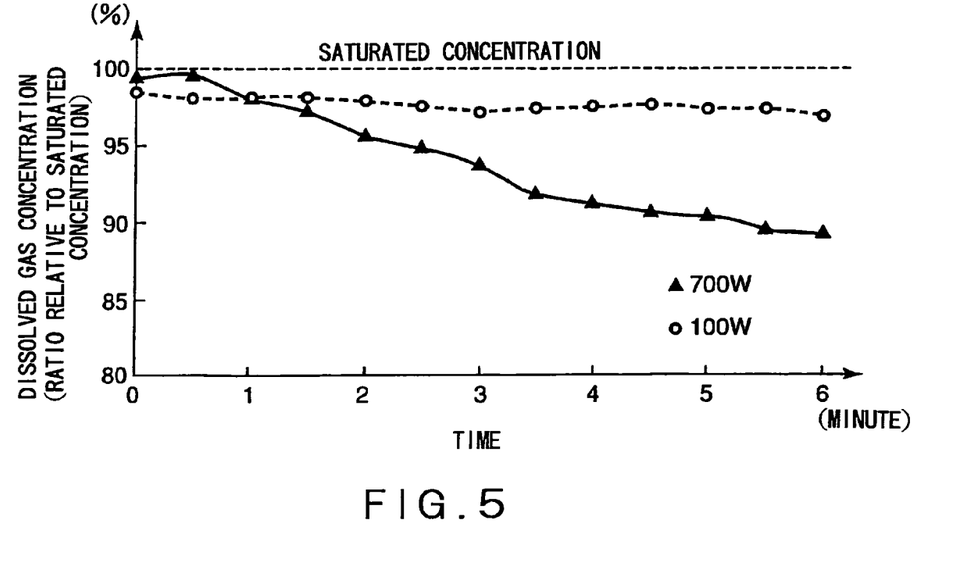
FIG. 5 is a graph showing an example of a change over time in a dissolved gas concentration of a gas dissolved in a cleaning liquid, in a case where ultrasonic waves were irradiated to the cleaning liquid in which the gas had been dissolved at substantially a saturated concentration.

FIG. 5 shows an example of a change over time in dissolved gas concentration, in a case where ultrasonic waves were irradiated to the cleaning liquid in which an air had been dissolved at substantially a saturated concentration. In the graph shown in FIG. 5, the axis of ordinate represents the concentration of the air dissolved in a deionized water as a ratio (percentage) relative to a saturated concentration (e.g., 18 ppm) of an air dissolved in a deionized water under the same condition. FIG. 5 shows a change in the dissolved gas concentration when ultrasonic waves of 700 W were irradiated to the cleaning liquid in the cleaning tank 12, and a change in the dissolved gas concentration when ultrasonic waves of 100 W were irradiated to the cleaning liquid in the cleaning tank 12. In the case where ultrasonic waves of 100 W were irradiated to the cleaning liquid in the cleaning tank 12, the gas dissolved in the cleaning liquid produced bubbles with an amount larger than an amount of an atmospheric air which was being dissolved in the cleaning liquid under an atmospheric pressure. Thus, the dissolved gas concentration of the cleaning liquid was gradually decreased. On the other hand, in the case where ultrasonic waves of 700 W were irradiated to the cleaning liquid in the cleaning tank 12, the production of bubbles of the air dissolved in the cleaning liquid was promoted, whereby the dissolved gas concentration of the cleaning liquid was rapidly decreased. In addition, by changing further a condition relating to the ultrasonic waves, the dissolved gas concentration could be more rapidly decreased.

In this embodiment shown in Table 1 and FIG. 3, during the fourth step, the ultrasonic waves are irradiated from the ultrasonic generator 30 to the cleaning liquid in the cleaning tank 12 with a large output (HIGH), such that the dissolved gas concentration of the cleaning liquid is decreased to a desired concentration range in a short time period. The fourth step is performed for 120 seconds from the time point t3 to a time point t4, during which the dissolved gas concentration of the cleaning liquid is decreased from the saturated concentration (e.g., 18%) to a concentration (e.g., 14%) corresponding to about 80% of the saturated concentration. In this embodiment, during the fourth step, wafers W to be processed are not immersed in the cleaning liquid in the cleaning tank 12. Thus, even when ultrasonic waves are irradiated from the ultrasonic generator 30 at a high output, there is no possibility that wafers are damaged. Accordingly, a generation output of the ultrasonic waves from the ultrasonic generator 30 can be appropriately set, to thereby decrease the dissolved gas concentration of the cleaning liquid to a desired concentration in a significantly short time period.

Then, as a fifth step, wafers W to be processed are delivered into the cleaning tank 12 and are immersed into the cleaning liquid in the cleaning tank 12. Specifically, the control device 18 drives the elevation mechanism (not shown) connected to the holding member 20. Thus, the holding member 20 holding the predetermined number of (e.g., 50) wafers W is lowered, so that the wafers W are immersed into the cleaning liquid in the cleaning tank 12. In this embodiment, during the fifth step, the control device 18 stops the irradiation of the ultrasonic waves from the ultrasonic generator 30, the supply of the cleaning liquid from the cleaning-liquid supply apparatus 40, and the supply of the gas from the gas supply apparatus 60.

As shown in FIG. 3, this step is performed between the time point t4 and a time point t5. During this step, the atmospheric air is dissolved in the cleaning liquid in the cleaning tank 12 which is exposed to the atmospheric air, and thus the concentration of the cleaning liquid is slightly increased. Thus, the fifth step has to be finished within a predetermined period from when the fourth step was finished (t4), and the following ultrasonic cleaning process has to be started.

Then, as a sixth step, the wafers W immersed in the cleaning liquid in the cleaning tank 12 are ultrasonically cleaned by irradiating ultrasonic waves to the cleaning liquid in the cleaning tank 12. Specifically, the control device 18 activates the ultrasonic generator 30 so as to irradiate the ultrasonic waves to the cleaning liquid in the cleaning tank 12. As a result, the ultrasonic waves are generated in the cleaning liquid in the cleaning tank 12. In this embodiment, during the sixth step, the control device 18 continues to operate the circulation pump 45, the temperature adjustment mechanism 46, and the chemical-element supply apparatus 55. Thus, during the sixth step, the cleaning liquid (SC1) is continuously circulated through the circulation path, with its temperature and concentration being maintained within predetermined ranges, respectively.

Consequently, the wafers W immersed in the cleaning liquid in the cleaning tank 12 are subjected to the ultrasonic cleaning process (megasonic cleaning process), so that particles (stains or the like) adhering to the surfaces of the wafers W are removed. Particularly in this embodiment, at the fourth step prior to the ultrasonic cleaning step, the dissolved gas concentration of the cleaning liquid is adjusted from the saturated concentration to the desired concentration. Thus, particles adhering to the surfaces of the wafers W can be removed at a high removal efficiency.

Figure 6:
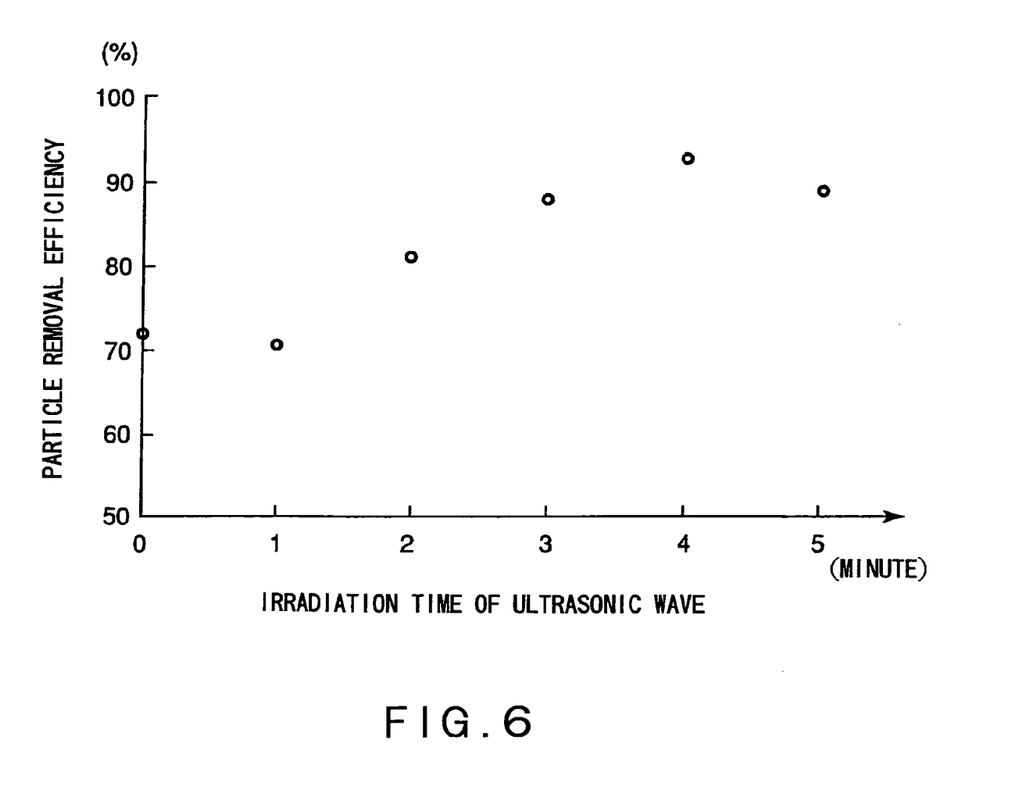
FIG. 6 is a graph showing an example of a relationship between a duration of time during an ultrasonic irradiation and a particle removal efficiency, at a step of adjusting a dissolved gas concentration of a gas dissolved in a cleaning liquid.

FIG. 6 shows a particle removal efficiency in wafers W, in a case where an air was saturated in a cleaning liquid at first, then a dissolved gas concentration of the cleaning liquid was decreased by irradiating ultrasonic waves to the cleaning liquid, then wafers W were immersed into the cleaning liquid, and the wafers W were ultrasonically cleaned. Values of the particle removal efficiency shown in FIG. 6 are values measured for wafers W which were processed under the same condition except that the irradiation period of the ultrasonic waves were different from each other when the dissolved gas concentration was decreased by irradiating the ultrasonic waves to the cleaning liquid. In the graph shown in FIG. 6, the axis of abscissa represents the duration of time (minute) in which the ultrasonic waves had been irradiated to the cleaning liquid before the wafers were immersed into the cleaning liquid. In the graph shown in FIG. 6, the axis of ordinate represents the removal efficiency of particles by the ultrasonic cleaning process. Herein, the particle removal efficiency is a ratio (percentage) of the number of particles, which were removed from the wafer W due to the ultrasonic cleaning process, relative to 4000 particles which were made to adhere to the wafers W in advance. Namely, the higher particle removal efficiency means that the larger amount of particles could be removed from the wafer W.

As shown in FIG. 6, the longer the irradiation period of ultrasonic waves was, the higher the particle removal efficiency became. However, when the irradiation period of the ultrasonic waves exceeded a certain period (4 minutes in the example shown in FIG. 6), the particle removal efficiency was then lowered. That is to say, an optimum dissolved gas concentration of the cleaning liquid which can maximize the particle removal efficiency is within a range that is larger than 0 ppm but is smaller than the saturated concentration. Thus, by adjusting the dissolved gas concentration at the above fourth step such that the dissolved gas concentration of the cleaning liquid takes a value within the optimum range, particles can be removed from the wafers W at a remarkably high removal efficiency.

As shown in Table 1 and FIG. 3, the sixth step is performed for 300 seconds from the time point t5 to a time point t6. During this step, the supply of the gas from the gas supply apparatus 60 is stopped. Thus, similarly to the fourth step, when ultrasonic waves are generated in the cleaning liquid, the gas dissolved in the cleaning liquid produce bubbles which then rise to the surface of the cleaning liquid. As a result, the dissolved gas concentration of the cleaning liquid in the cleaning tank 12 is decreased during the sixth step. However, at the sixth step in which an irradiation output of the ultrasonic waves is small, the dissolved gas concentration is slowly decreased as compared with the fourth step in which an irradiation output of ultrasonic wave is large.

Then, as a seventh step, the dissolved gas concentration of the cleaning liquid in the cleaning tank 12 is again increased to the saturated concentration. Namely, a gas is dissolved in the cleaning liquid in the cleaning tank 12 so as to be again saturated. To be more specific, the generation of the ultrasonic waves by the ultrasonic generator 30 is stopped, and a gas is supplied from the gas supply apparatus 60 into the cleaning tank 12 so as to increase the dissolved gas concentration of the gas dissolved in the cleaning liquid in the cleaning tank 12 is increased to the saturated concentration. As shown in Table 1 and FIG. 3, the seventh step is performed for 30 seconds from the time point t6 to a time point t7. During this time period, the dissolved gas concentration of the cleaning liquid is increased up to the saturated concentration.

In the seventh step, the substrate cleaning apparatus 10 is substantially similarly operated in the above third step. Thus, the detailed description of the seventh step overlapping with the third step is omitted.

Next, as an eighth step, the wafers W immersed in the cleaning liquid in the cleaning tank 12 are ultrasonically cleaned, by irradiating ultrasonic waves to the cleaning liquid in the cleaning tank 12. Specifically, similarly to the sixth step, the control device 18 activates the ultrasonic generator 30 so as to irradiate ultrasonic waves to the cleaning liquid in the cleaning tank 12. Meanwhile, the supply of the gas from the gas supply apparatus 60 is stopped. As a result, ultrasonic waves are generated in the cleaning liquid in the cleaning tank 12, so that the wafers W are ultrasonically cleaned.

However, the ultrasonic cleaning condition in the eighth step differs from the ultrasonic cleaning condition in the sixth step in some points. At first, as shown in FIG. 3, the dissolved gas concentrations of the cleaning liquid at the start of the ultrasonic cleaning processes differ from each other. Specifically, the dissolved gas concentration at the start of the sixth step is less than the saturated concentration, while the dissolved gas concentration at the start of the eighth step is the saturated concentration. Further, as shown in Table 1, the irradiation outputs of the ultrasonic waves by the ultrasonic generator 30 differ from each other. Furthermore, as shown in Table 1, at the sixth step, the cleaning liquid is circulated by the pressure generated by the circulation pump 45, while at the eighth step, the driving of the circulation pump 45 is stopped. Owing to the various differences in the ultrasonic cleaning conditions between the sixth step and the eighth step, the propagation manner of the ultrasonic waves in the cleaning liquid in the cleaning tank 12 greatly differ between the sixth step and the eighth step. Consequently, in the plate surface of the wafer W to be processed, an area from which particles are easily removed at the sixth step and an area from which particles are easily removed at the eighth step differ from each other. Accordingly, due to the performance of the plural ultrasonic cleaning steps of the different ultrasonic conditions, particles can be removed from the overall plate surface of the wafer W at a high removal efficiency. For this reason, it is not only that the particle removal efficiency can be increased, but also that particle can be uniformly removed from the overall plate surface of each of the wafers W. Moreover, it is possible to reduce the process non-uniformity between the wafers W which are simultaneously processed in the same cleaning tank 12.

As shown in Table 1 and FIG. 3, the eighth step is performed for 270 seconds from the time point t7 to a time point t8. During this step, the supply of the gas from the gas supply apparatus 60 is stopped. Thus, similarly to the fourth and sixth steps, when ultrasonic waves are generated in the cleaning liquid, the gas dissolved in the cleaning liquid produces bubbles which then rise to the surface of the cleaning liquid. As a result, the dissolved gas concentration of the cleaning liquid in the cleaning tank 12 is decreased during the eighth step.

In the eighth step, the substrate cleaning apparatus 10 is substantially similarly operated in the above sixth step except the points as have been described above. Thus, the detailed description of the eighth step overlapping with the sixth step is omitted.

Then, as a ninth step, the cleaned wafers W are drawn out from the cleaning tank 12. Specifically, the control device 18 drives the elevation mechanism (not shown) connected to the holding member 20. Thus, the holding member 20 holding the predetermined number of (e.g., 50) wafers W is lifted, so that the wafers W are drawn out from the cleaning liquid in the cleaning tank 12. The drawn-out wafers W are delivered to an apparatus in which the wafers W are then processed, e.g., a rinse tank for rinsing the wafers W.

In this embodiment, during the ninth step, the control device 18 stops the irradiation of the ultrasonic waves from the ultrasonic generator 30, the supply of the cleaning liquid from the cleaning-liquid supply apparatus 40, and the supply of the gas from the gas supply apparatus 60. As shown in FIG. 3, the ninth step is performed between the time period t8 and a time period t9. During this step, the atmospheric air is dissolved in the cleaning liquid in the cleaning tank 12 which is exposed to the atmospheric air, and thus the concentration of the cleaning liquid is slightly increased.

Then, as a tenth step, the dissolved gas concentration of the cleaning liquid in the cleaning tank 12 is again increased to the saturated concentration. Namely, a gas is dissolved in the cleaning liquid in the cleaning tank 12 so as to be again saturated. Specifically, the generation of the ultrasonic waves by the ultrasonic generator 30 is stopped, and a gas is supplied into the cleaning tank 12 so as to increase the dissolved gas concentration of the gas dissolved in the cleaning liquid in the cleaning tank 12 to the saturated concentration. As shown in Table 1 and FIG. 3, the tenth step is performed for 30 seconds from the time point t9 to a time point t10. During this time period, the dissolved gas concentration of the cleaning liquid is increased up to the saturated concentration.

During the tenth step, wafers W to be processed are not immersed in the cleaning liquid in the cleaning tank 12. Thus, even when the supply rates of nitrogen and oxygen from the gas supply apparatus 60 are increased, there is no possibility that wafers are damaged. Accordingly, the supply rates of the nitrogen and the oxygen from the gas supply apparatus 60 can be appropriately set, to thereby increase the dissolved gas concentration of the cleaning liquid to the saturated concentration in a significantly short time period.

In the tenth step, the substrate cleaning apparatus 10 is substantially similarly operated in the above third and seventh steps. Thus, the detailed description of the tenth step overlapping with the third and seventh step is omitted.

In accordance with the manner as described above, the process to the wafers in one lot which are simultaneously received and processed in the same processing tank 12 is completed. At the end of the tenth step (time point t10), the dissolved gas concentration of the cleaning liquid in the cleaning tank 12 has reached the saturated concentration. Thus, when the process is continuously performed to a succeeding lot to be processed, the above fourth step to the tenth step are performed. Thus, the conditions relating to the dissolved gas concentration of the cleaning liquid can be made uniform between the plural lots. Accordingly, particles can be removed from wafers W contained in different lots at substantially the same removal efficiency.

According to the above embodiment, the dissolved gas concentration of the gas dissolved in the cleaning liquid into which wafers W are to be immersed is temporarily increased to the saturated concentration. At this time, the dissolved gas concentration of the cleaning liquid can be promptly increased to the saturated concentration with the simple procedure. Thus, when wafers W in different lots are processed, the conditions relating to the dissolved gas concentration can be promptly made uniform with the simple procedure. Consequently, non-uniformity of the particle removal efficiency between the lots, which may be caused by the different dissolved gas concentrations, can be reduced.

With respect to the aforementioned embodiment, various modifications are possible within a scope of the present invention. Examples of these modifications are described below.

Figure 7:
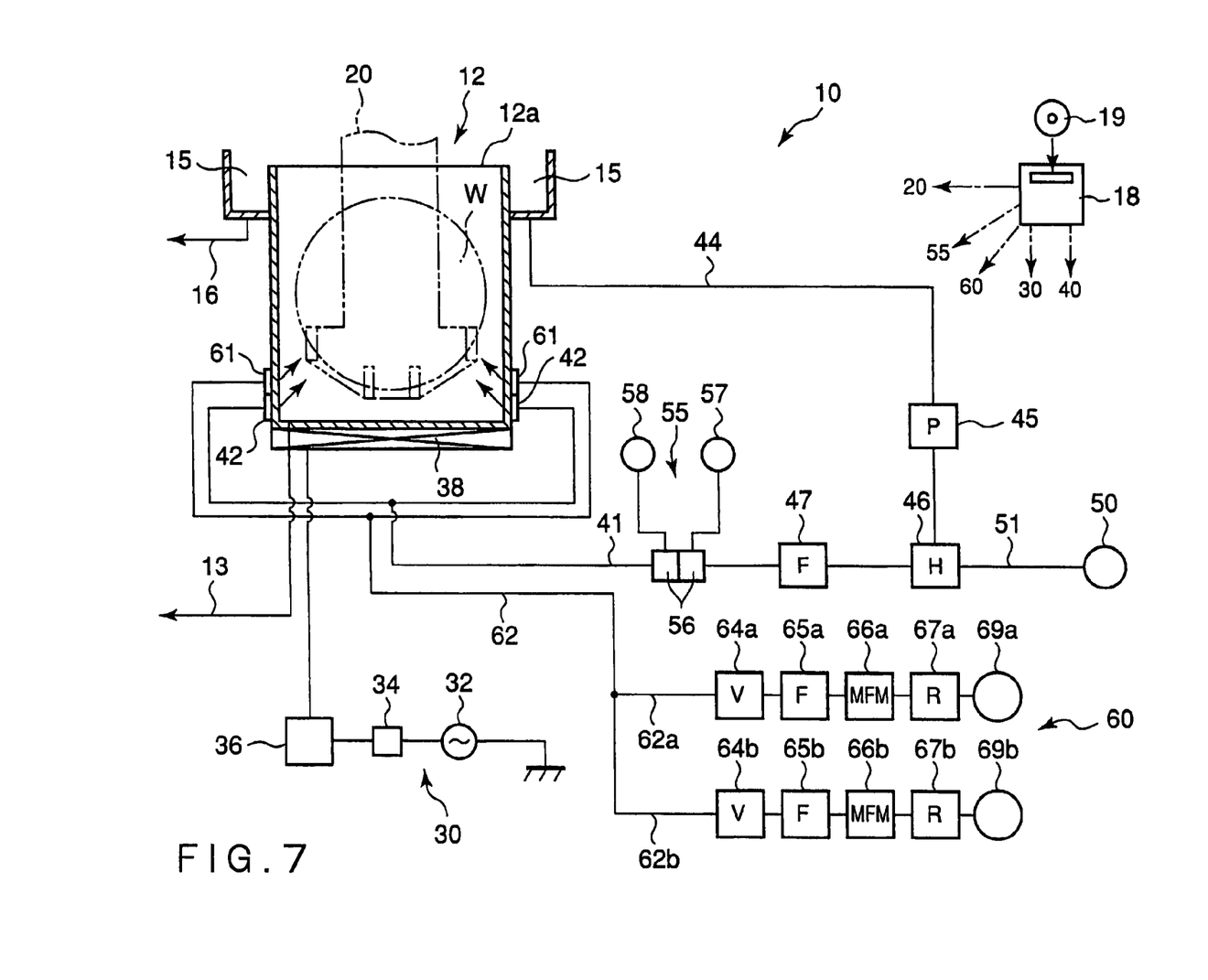
FIG. 7 is a view corresponding to FIG. 1, showing an alternative example of the substrate cleaning apparatus.

In the above embodiment, although there has been described by way of example that the gas supply pipe 62 of the gas supply apparatus 60 is connected to the cleaning-liquid supply pipe 41 of the cleaning-liquid supply apparatus 40, the present invention is not limited thereto. For example, as shown in FIG. 7, the gas supply pipe 62 of the gas supply apparatus 60 may be connected to the cleaning tank 12, so that the gas supply member 61 of the gas supply apparatus 60 directly supplies a gas into the cleaning tank 12. In the example shown in FIG. 7, the gas supply member 61 may have the same structure as that of the above cleaning liquid nozzle 42, for example. According to the example shown in FIG. 7, the gas is discharged to the cleaning liquid at an area whose pressure is close to the atmospheric pressure. Thus, the gas discharged from the gas supply member 61 can be dissolved in the cleaning liquid, at substantially the same dissolved gas concentration as the saturated concentration of the cleaning liquid in the cleaning tank 12 which is exposed to the atmospheric air.

In FIG. 7, the same parts as those of the above embodiment shown in FIGS. 1 to 6 are indicated by the same reference numbers, and the detailed description of the example shown in FIG. 7 overlapping with the above embodiment is omitted.

In the above embodiment, although there has been described by way of example that the step of ultrasonically cleaning the wafers W is performed twice (sixth step and eighth step), and, performed between the two ultrasonic cleaning steps is the step of increasing the dissolved gas concentration of the cleaning liquid to the saturated concentration (seventh step), the present invention is not limited thereto. The step of increasing the dissolved gas concentration of the cleaning liquid to the saturated concentration, which is performed between the two ultrasonic cleaning steps, may be omitted. Also in such an example, as long as the conditions except the dissolved gas concentration of the cleaning liquid differ from each other between the two ultrasonic cleaning steps, particles can be uniformly removed from all the regions of one wafer W, and the process non-uniformity between the wafers W in the same lot can be reduced.

In addition, in the above embodiment, although there has been described by way of example that the two ultrasonic cleaning steps of different ultrasonic cleaning conditions are performed, the present invention is not limited thereto. For example, the ultrasonic process step may be performed either only one time or three or more times.

In addition, in the above embodiment, there has been described by way of example that, after the wafers are drawn out from the cleaning liquid, there is performed the step of increasing the dissolved gas concentration of the cleaning liquid to the saturated concentration (tenth step). However, not limited thereto, this step may be omitted, for example. As long as the cleaning liquid in the cleaning tank 12 is exposed to the atmospheric air, the atmospheric air is gradually dissolved into the cleaning liquid through the liquid surface. Namely, when wafers W to be processed in a succeeding lot are immersed into the cleaning liquid after some time has passed from when the wafers w were drawn out, it can be expected that the dissolved gas concentration of the cleaning liquid returns to the saturated concentration. Therefore, only in a case where the dissolved gas concentration of the cleaning liquid does not return to the saturated concentration or a case where it is presumed that the dissolved gas concentration of the cleaning liquid does not return to the saturated concentration, there may be performed the step of increasing the dissolved gas concentration of the cleaning liquid to the saturated concentration, immediately after the wafers W in the precedent lot are drawn out from the cleaning liquid, or immediately before the wafers W in the succeeding lot are immersed into the cleaning liquid.

In addition, in the above embodiment, although there has been described by way of example that there is performed the step of increasing the dissolved gas concentration of the cleaning liquid to the saturated concentration (third step), before the wafers W are immersed into the cleaning liquid, the present invention is not limited thereto. For example, the cleaning liquid in which the gas has been dissolved at the saturated concentration may be sent through the connection pipe 51 to the supply pipe 41. Since the dissolved gas concentration of the cleaning liquid to be stored in the cleaning tank 12 has already reached the saturated concentration, the step of increasing the dissolved gas concentration of the cleaning liquid to the saturated concentration, which is performed before the wafers W are immersed into the cleaning liquid, may be omitted.

In addition, in the above embodiment, there has been described by way of example that, the dissolved gas concentration of the cleaning liquid in the cleaning tank 12 is adjusted by irradiating the ultrasonic waves to the cleaning liquid in the cleaning tank 12 while the supply of the gas into the cleaning tank 12 is being stopped. However, not limited thereto, the dissolved gas concentration of the cleaning liquid in the cleaning tank 12 may be adjusted by irradiating the ultrasonic waves to the cleaning liquid in the cleaning tank 12 while the gas is being supplied into the cleaning tank 12. For example, in this step of adjusting the dissolved gas concentration of the cleaning liquid in the cleaning tank 12 by irradiating the ultrasonic waves to the cleaning liquid in the cleaning tank 12, the ultrasonic waves may be irradiated to the cleaning liquid in the cleaning tank 12 while the gas is being supplied into the cleaning tank 12 for a while, e.g., for a predetermined time period from the start of the step, and thereafter, the ultrasonic waves may be irradiated to the cleaning liquid in the cleaning tank 12 while the supply of the gas is being stopped, so as to adjust the dissolved gas concentration of the cleaning liquid in the cleaning tank 12.

In addition, in the above embodiment, there has been described by way of example that, after the dissolved gas concentration of the cleaning liquid is increased to the saturated concentration, there is performed the step of adjusting the dissolved gas concentration of the cleaning liquid by irradiating the ultrasonic waves. However, not limited thereto, this step may be omitted. Even when this step is omitted, it is possible to reduce the non-uniformity of particle removal efficiency between lots.

In addition, at the various steps in the above embodiment, there has been described by way of example that the cleaning liquid flowing out from the cleaning tank 12 to the outer tank 15 is circulated and supplied again to the cleaning tank 12 through the return pipe 44 by driving the circulation pump 45. However, not limited thereto, the drive of the circulation pump 45 may be stopped. For example, at the step of cleaning the wafers W by irradiating the ultrasonic waves, the supply of the cleaning liquid to the cleaning tank 12 may be stopped.

In addition, in the above embodiment, there has been described by way of example that, after the cleaned wafers are drawn out from the cleaning tank 12, wafers W (wafers in another lot) to be successively processed are cleaned by using the cleaning liquid remaining in the cleaning tank 12. However, not limited thereto, the cleaning liquid in the cleaning tank 12 may be replaced with a new one for each time the processed wafers W are replaced with wafers W to be processed. Namely, before the wafers W in a lot to be successively processed are accommodated in the cleaning tank 12, the cleaning liquid, which has been used for cleaning the wafers W in the precedent lot and remains in the cleaning tank 12, may be discharged (drained) from the cleaning tank 12 through the drain pipe 13. As a concrete example, it is possible to repeat the steps 1, 2, 3, 4, 5, 6, and 9, which have been described in the aforementioned embodiment. In this case, when the cleaning liquid of the saturated concentration is supplied into the cleaning tank 12 from the supply pipe 41, the step 3 may be omitted. Further, the steps 2 and 4 may be suitably omitted. Furthermore, as described above, the drive of the circulation pump 45 may be stopped at the step 6.

In addition, in the above embodiment, there has been described by way of example that the gas supply apparatus 60 supplies nitrogen and oxygen into the cleaning liquid, and that the dissolved gas concentrations of the nitrogen and the oxygen occupying the large part of the air are controlled. However, not limited thereto, the gas supply apparatus 60 may supply an air. Alternatively, the gas supply apparatus 60 may supply one or more gases other than nitrogen and oxygen, and the dissolved gas concentration of such gases in the cleaning liquid may be controlled.

In addition, in the above embodiment, although there has been described by way of example that the wafers W are ultrasonically cleaned with the use of SC1 as the cleaning liquid, the present invention is not limited thereto. The wafers W may be ultrasonically cleaned by using another chemical liquid as a cleaning liquid. Alternatively, the wafers W to be processed may be ultrasonically cleaned by using a deionized water as a cleaning liquid.

In addition, it is possible to suitably combine the several modifications of the embodiment which have been described as above.

As has been described above, the substrate cleaning apparatus 10 is provided with the control device 18 including a computer. Due to the control device 18, the respective constituent elements of the substrate cleaning apparatus 10 are adapted to be operated so as to accomplish the cleaning process of wafers W to be processed. The present invention also provides a program executed by the computer of the control device 18 so as to accomplish the cleaning process of wafers W with the use of the substrate cleaning apparatus 10. Moreover, the present invention provides the storage medium 19 storing this program. Herein, the storage medium 19 may be a memory such as a ROM and a RAM, or a disc-like storage medium such as a hard disc and a CD-ROM.

In the aforementioned description, there has been described by way of example that the substrate cleaning process, the substrate cleaning apparatus, the program, and the storage medium of the present invention are applied to a cleaning process of wafers W. However, not limited thereto, the substrate cleaning process, the substrate cleaning apparatus, the program, and the storage medium of the present invention may be applied to a process of LCD substrates and CD substrates.

What is claimed is:

1. A substrate cleaning method comprising:
   a step of supplying a cleaning liquid into a cleaning tank and filling the cleaning tank with the cleaning liquid;
   a step of supplying a gas, by performing bubbling, into the cleaning tank, while an irradiation of ultrasonic waves to the cleaning liquid in the cleaning tank is being stopped, so as to increase a dissolved gas concentration of the gas dissolved in the cleaning liquid in the cleaning tank to a saturated concentration;
   a step of irradiating ultrasonic waves to the cleaning liquid in the cleaning tank so as to adjust the dissolved gas concentration of the cleaning liquid in the cleaning tank;
   a step of immersing the substrate into the cleaning liquid in the cleaning tank, and
   a step of irradiating ultrasonic waves to the cleaning liquid in the cleaning tank so as to clean a substrate immersed in the cleaning liquid in the cleaning tank,
   wherein the steps are performed in the above order.

2. The substrate cleaning method according to claim 1, wherein
   a step of increasing the dissolved gas concentration to the saturated concentration is performed after the substrate that has been cleaned at the step of cleaning the substrate is taken out from the cleaning liquid in the cleaning tank.

3. The substrate cleaning method according to claim 2, further comprising a step of, before a substrate to be successively processed is immersed into the cleaning liquid in the cleaning tank, irradiating ultrasonic waves to the cleaning liquid in the cleaning tank so as to adjust the dissolved gas concentration of the cleaning liquid in the cleaning tank.

4. The substrate cleaning method according to claim 1, wherein the step of cleaning the substrate is performed at least twice so as to at least include a first step of cleaning the substrate performed before the step of increasing the dissolved gas concentration of the cleaning liquid to the saturated concentration and a second step of cleaning the substrate performed after the step of increasing the dissolved gas concentration of the cleaning liquid to the saturated concentration.

5. The substrate cleaning method according to claim 1, wherein:
   the step of cleaning the substrate is performed at least twice so as to at least include a first step of cleaning the substrate and a second step of cleaning the substrate;
   the step of increasing the dissolved gas concentration of the cleaning liquid to the saturated concentration is performed at least twice so as to at least include a first step of increasing the dissolved gas concentration of the cleaning liquid to the saturated concentration and a second step of increasing the dissolved gas concentration of the cleaning liquid to the saturated concentration; and
   one of the first step of increasing the dissolved gas concentration of the cleaning liquid to the saturated concentration and the second step of increasing the dissolved gas concentration of the cleaning liquid to the saturated concentration is performed between the first step of cleaning the substrate and the second step of cleaning the substrate.

6. The substrate cleaning method according to claim 1, further comprising a step of, before a substrate to be successively processed is delivered into the cleaning tank, replacing the cleaning liquid in the cleaning tank with a new one.

7. The substrate cleaning method according to claim 1, wherein
   in the step of cleaning the substrate, the cleaning liquid overflowing from the cleaning tank is circulated and supplied into the cleaning tank.

8. The substrate cleaning method according to claim 1, wherein
   in the step of cleaning the substrate, the supply of the cleaning liquid into the cleaning tank is stopped.

9. The substrate cleaning method according to claim 1, further comprising a step of adjusting a temperature of the cleaning liquid in the cleaning tank.

10. A non-transitory storage medium storing a program to be executed by a control device that controls a substrate cleaning apparatus, the storage medium causing the substrate cleaning apparatus to accomplish a cleaning method for a substrate to be processed according to claim 1 when the program is executed by the control device.

11. A substrate cleaning method comprising:
    a step of supplying a cleaning liquid into a cleaning tank and filling the cleaning tank with the cleaning liquid;
    a step of supplying a gas while no irradiation of ultrasonic waves to the cleaning liquid in the cleaning tank occurs, so as to increase a dissolved gas concentration of the gas dissolved in the cleaning liquid in the cleaning tank to a saturated concentration, wherein the gas is supplied into the cleaning liquid flowing toward the cleaning tank, and is supplied together with the cleaning liquid into the cleaning tank;
    a step of irradiating ultrasonic waves to the cleaning liquid in the cleaning tank so as to adjust the dissolved gas concentration of the cleaning liquid in the cleaning tank;
    a step of immersing the substrate into the cleaning liquid in the cleaning tank; and
    a step of irradiating ultrasonic waves to the cleaning liquid in the cleaning tank so as to clean a substrate immersed in the cleaning liquid in the cleaning tank,
    wherein the steps are performed in the above order.

12. The substrate cleaning method according to claim 11, wherein
    the gas is supplied into the cleaning liquid that has overflown from the cleaning tank and is then circulated and again supplied into the cleaning tank.

* * * * *